United States Patent
Yamada et al.

(10) Patent No.: US 6,919,617 B2
(45) Date of Patent: Jul. 19, 2005

(54) SEMICONDUCTOR DEVICE AND MANUFACTURING METHOD THEREOF

(75) Inventors: Masaki Yamada, Yokohama (JP); Hideki Shibata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/462,880

(22) Filed: Jun. 17, 2003

(65) Prior Publication Data

US 2004/0155344 A1 Aug. 12, 2004

(30) Foreign Application Priority Data

Feb. 10, 2003 (JP) ........................................ 2003-032506

(51) Int. Cl.$^7$ .............................................. H01L 23/58
(52) U.S. Cl. ........................ 257/635; 257/211; 257/758
(58) Field of Search .................................. 257/758, 751, 257/635, 636, 637, 700, 736, 748, 750, 28, 349, 486

(56) References Cited

U.S. PATENT DOCUMENTS 6,008,127 A    12/1999  Yamada
6,476,491 B2 * 11/2002  Harada et al. ............... 257/758
2004/0004287 A1 *  1/2004  Shimizu et al. .............. 257/758

FOREIGN PATENT DOCUMENTS

JP         2001-345380         12/2001

* cited by examiner

*Primary Examiner*—David Nelms
*Assistant Examiner*—Long Tran
(74) *Attorney, Agent, or Firm*—Frommer Lawrence & Haug LLP

(57) ABSTRACT

There is disclosed a semiconductor device comprising a first metal wiring buried in a first wiring groove formed, via a first barrier metal, in a first insulating layer formed on a semiconductor substrate, a second insulating layer formed on the first metal wiring, a via plug formed of a metal buried, via a second barrier metal, in a via hole formed in the second insulating layer, a third insulating layer formed on the second insulating layer in which the via plug is buried, and a second metal wiring buried in a second wiring groove formed in the third insulating layer via a third barrier metal having a layer thickness of layer quality different from that of the second barrier metal.

22 Claims, 4 Drawing Sheets

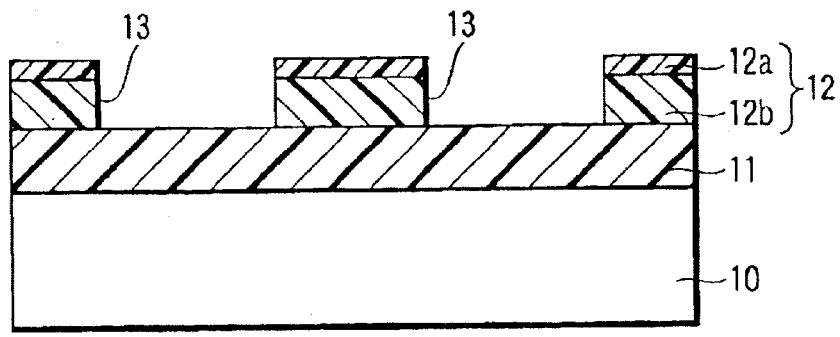
F I G. 1A
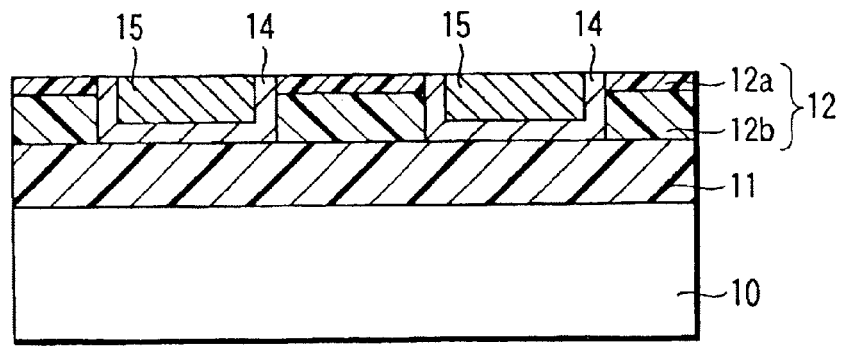
F I G. 1B
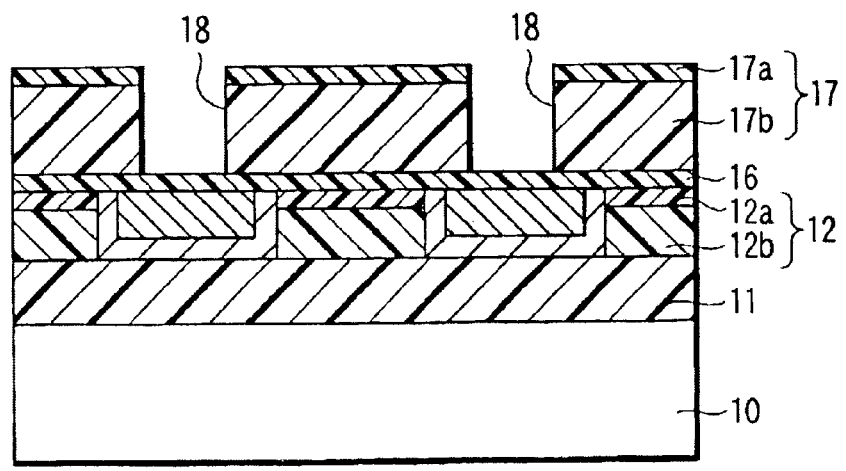
F I G. 1C

SEMICONDUCTOR DEVICE AND MANUFACTURING METHOD THEREOF

CROSS-REFERENCE TO RELATED APPLICATIONS

This application is based upon and claims the benefit of priority from the prior Japanese Patent Application No. 2003-032506, filed Feb. 10, 2003, the entire contents of which are incorporated herein by reference.

BACKGROUND OF THE INVENTION

1. Field of the Invention

The present invention relates to a semiconductor device and manufacturing method, particularly to a semiconductor device and manufacturing method in which two or more wiring layers are stacked and an interlayer wiring is performed by a via plug, and is used in a semiconductor device in which a low-resistance metal wiring such as copper wiring is used.

2. Description of the Related Art

In recent years, in important parts of a computer or a communication apparatus, large-scale integration (LSI) has frequently been used in which a large number of transistors or resistors are interconnected to achieve an electric circuit, and integrated and formed on one chip. Therefore, performance of the whole apparatus largely depends on that of a single LSI unit. Enhancement of the performance of the LSI unit can be realized by promoting the integration by miniaturizing elements such as the transistors or resistors.

However, by the miniaturization, a problem has become remarkable that RC delay caused by wiring resistance R and inter-wiring capacity C coupling deteriorates a high speed operation of the elements. To solve the problem, it is necessary to reduce the inter-wiring capacity by using an insulating layer material having a small dielectric constant. Moreover, instead of using the insulating material of the small dielectric constant, a method of reducing layer thicknesses of wirings is used to reduce an opposing area of opposite wirings.

However, with advancement of the reduction of the wiring thickness, a wiring resistance increases, and the RC delay is increased. To solve the problem, a low-resistance metal such as copper has been used as the wiring metal. However, when the miniaturization advances, and a wiring width is reduced, a percentage of copper wiring in the whole wiring used in the apparatus decreases. As a result, a reduction effect of the wiring resistance using the copper decreases (e.g., see Jpn. Pat. Appln. KOKAI Publication No. 2001-345380).

A cause for the decrease of the percentage of copper in the wiring will is as follows. When a copper wiring is formed in a wiring groove and a via hole coupled to the wiring groove by a dual-damascene process, a barrier metal is first formed and then copper is deposited to form the copper wiring. However, the layer thickness of the barrier metal cannot be assured at side walls of a bottom portion of the via hole, thereby decreasing the reliability of the copper wiring. Accordingly, the barrier metal should be made thick even at the bottom of the via hole and the barrier metal cannot catch up with a reduction ratio of a copper wiring sectional area.

As described above, for a semiconductor device in which the low-resistance metal is used as the wiring metal, with the advancement of the miniaturization and the reduction of the wiring width, the reduction effect of the wiring resistance has been reduced and it is difficult to enhance the reliability of the metal wiring.

BRIEF SUMMARY OF THE INVENTION

According to a first aspect of the present invention, there is provided a semiconductor device comprising: a first metal wiring buried, via a first barrier metal, in a first wiring groove formed in a first insulating layer formed on a semiconductor substrate; a second insulating layer formed on the first metal wiring; a via plug formed of a metal buried, via a second barrier metal, in a via hole formed in the second insulating layer; a third insulating layer formed on the second insulating layer in which the via plug is buried; and a second metal wiring buried in a second wiring groove formed in the third insulating layer via a third barrier metal having a layer thickness different from that of the second barrier metal.

According to a second aspect of the present invention, there is provided a semiconductor device comprising: a first metal wiring buried, via a first barrier metal, in a first wiring groove formed in a first insulating layer formed on a semiconductor substrate; a second insulating layer formed on the first metal wiring; a via plug formed of a metal buried, via a second barrier metal, in a via hole formed in the second insulating layer; a third insulating layer formed on the second insulating layer in which the via plug is buried; and a second metal wiring buried in a second wiring groove formed in the third insulating layer via a third barrier metal formed of a material different from that of the second barrier metal.

According to a third aspect of the present invention, there is provided a semiconductor device comprising: a first metal wiring buried, via a first barrier metal, in a first wiring groove formed in a first insulating layer formed on a semiconductor substrate; a second insulating layer formed on the first metal wiring; a via plug formed of a metal buried, via a second barrier metal, in a via hole formed in the second insulating layer; a third insulating layer formed on the second insulating layer in which the via plug is buried; and a second metal wiring buried in a second wiring groove formed in the third insulating layer via a third barrier metal which is formed in a process different from that of the second barrier metal.

Moreover, according to another aspect of the present invention, there is provided a manufacturing method of the semiconductor device in which one of the first, second, and third aspects of the present invention is manufactured using a single-damascene process, comprising: forming a first insulating layer corresponding to a first wiring layer on a semiconductor substrate; forming a first wiring groove in the first insulating layer; forming a first barrier metal on the whole upper surface of the first insulating layer including the first wiring groove; forming a first metal layer on the whole upper surface of the first barrier metal; removing a portion other than a portion in the first wiring groove from the first metal layer and first barrier metal to form the first wiring layer; forming a second insulating layer on the first wiring layer; forming a connection hole in the second insulating layer; forming a second barrier metal in the whole upper surface of the second insulating layer including the connection hole; forming a second metal layer in the whole upper surface of the second barrier metal; removing a portion other than a portion in the connection hole from the second metal layer and second barrier metal to form a via plug; forming a third insulating layer corresponding to a second wiring layer on the whole upper surface of the second insulating layer in which the via plug is formed; forming a second wiring groove in the third insulating layer; forming a third barrier metal on the whole upper surface of the third insulating layer including the second wiring groove with a thickness different from that of, using a material different from that of, or using a process different from that of the second barrier metal; forming a third metal layer in the whole upper surface of the third barrier metal; and removing a portion deposited on the upper surface of the third insulating layer from the third metal layer and third barrier metal to leave the second wiring layer in the second wiring groove.

Furthermore, according to further aspect of the present invention, there is provided a manufacturing method of a semiconductor device, comprising: forming a first insulating layer corresponding to a first wiring layer on a semiconductor substrate; forming a first wiring groove in the first insulating layer; forming a first barrier metal on the whole upper surface of the first insulating layer including the first wiring groove; forming a first metal layer on the whole upper surface of the first barrier metal; removing a portion other than a portion in the first wiring groove from the first metal layer and first barrier metal to form the first wiring layer; forming a second insulating layer on the first wiring layer; forming a connection hole in the second insulating layer; forming a second barrier metal on the inner surface of the connection hole; forming a third insulating layer corresponding to a second wiring layer on the whole upper surface of the second insulating layer including the connection hole; forming the second wiring groove and also forming the connection hole again in the third insulating layer; forming a third barrier metal on the surface of the second barrier metal on the inner surface of the connection hole and on the whole upper surface of the third insulating layer including the second wiring groove on the whole upper surface of the third insulating layer including the second wiring groove with a thickness different from that of, using a material different from that of, or using a process different from that of the second barrier metal; forming a third metal layer on the whole upper surface of the third barrier metal; and removing a portion deposited on the upper surface of the third insulating layer from the third metal layer and third barrier metal to leave a via plug in the connection hole and to leave the second wiring layer in the second wiring groove.

BRIEF DESCRIPTION OF THE SEVERAL VIEWS OF THE DRAWING

FIG. 1A is a sectional view showing a manufacturing step of a semiconductor device including a multi-layered metal wiring according to a first embodiment of the present invention;

FIG. 1B is a sectional view showing a manufacturing step subsequent to the step of FIG. 1A;

FIG. 1C is a sectional view showing a step subsequent to the step of FIG. 1B;

DETAILED DESCRIPTION OF THE INVENTION

Figure 1D:
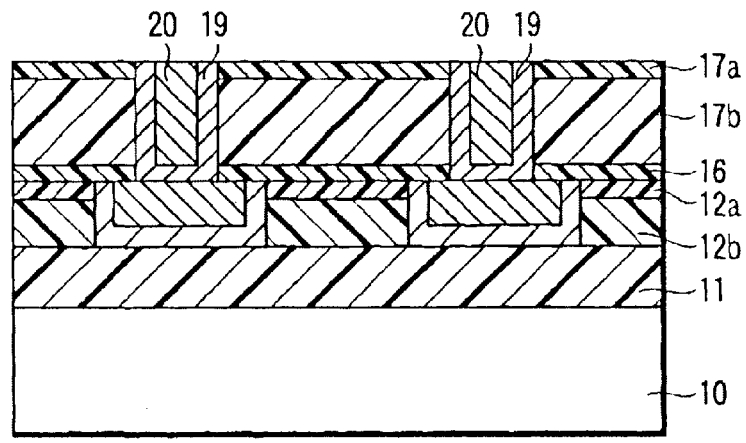
FIG. 1D is a sectional view showing a step subsequent to the step of FIG. 1C.

Embodiments of the present invention will be described hereinafter in detail with reference to the drawings.

<First Embodiment>

FIGS. 1A to 1F show sectional views in manufacturing steps of a semiconductor device including a multi-layered metal wiring according to a first embodiment.

In the present embodiment, an example will be described. In the embodiment, when a single-damascene process is used to form a fill-in type Cu wiring, an insulating layer including a diffusion preventing function of Cu and oxidation preventing function of Cu is selectively formed on the Cu wiring.

It is to be noted that in the sectional view of the present embodiment, a forming step of an element isolating structure and MOSFET is omitted, and a step of forming the fill-in type Cu wiring and subsequently alternately stacking an insulating layer and a metal wiring to form a metal wiring layer having a unit of two layers is shown.

First, as shown in FIG. 1A, a first interlayer insulating layer 11 acting as an insulating isolation layer is deposited on a semiconductor substrate 10. Thereafter, to form a first metal wiring, a second interlayer insulating layer 12 having a low dielectric constant is deposited as the insulating layer between the wirings. As the second interlayer insulating layer 12, in the present embodiment, a lamination structure of an $SiO_2$ layer 12a/methylpolysiloxane-based insulating layer 12b using an inorganic insulating layer as a cap is used. Here, the dielectric constant of $SiO_2$ layer 12a is about 3.9, and that of methylpolysiloxane-based layer 12b is about 2.2. Next, a resist (not shown) is used as a mask to form first wiring grooves 13 by means of reactive ion etching (RIE) process.

Thereafter, as shown in FIG. 1B, a Ta layer for forming a first barrier metal 14 is deposited on each of an inner surface of the first wiring grooves 13 by a sputter process. Next, a Cu layer is deposited on the $SiO_2$ layer 12a including the first wiring grooves 13 for forming first wirings 15 using sputter and plating processes. Thereafter, a chemical mechanical polishing (CMP) process is used to flatten the Cu layer to left a portion of the Cu layer as the first wirings 15 only in the first wiring grooves 13.

Next, as shown in FIG. 1C, a first diffusion preventing layer 16 having a Cu diffusion preventing function and Cu oxidation preventing function is formed on the whole surfaces of the first wiring 15 and second interlayer insulating layer 12. Thereafter, a third interlayer insulating layer 17 is deposited on the whole surface of the first diffusion preventing layer 16. Here, as the third interlayer insulating layer 17, a lamination structure of an $SiO_2$ layer 17a/ methylpolysiloxane-based insulating layer 17b using the inorganic insulating layer as the cap insulating layer is used. Thereafter, patterning is performed to the third interlayer insulating layer 17 using a resist film (not shown) to form interlayer connection holes (via holes) 18 for connecting the first wiring layer to the second wiring layer. As a result, portions of the diffusion preventing layer 16 are exposed at bottom portions of the connection holes 18.

Next, as shown in FIG. 1D, the diffusion preventing layer 16 exposed at a bottom portion of the via holes 18 is etched/removed, and a second barrier metal 19 and a metal layer for forming via plugs 20 are successively deposited on the whole surface of the interlayer insulating layer 17 including the connection holes 18. In this case, Ta is deposited at a thickness of 20 nm as the second barrier metal 19, and the Cu layer is deposited at a thickness of 60 nm on the Ta barrier metal 19 in the connection holes 18.

Next, an electrolytic plating process is used to deposit a Cu layer of about 400 nm on the whole upper surface of the third interlayer insulating layer 17 including the via holes 18 via the Cu layer of 60 nm thick. Thereafter, the CMP process is used to flatten the Cu layer, to left as the via plugs 20 only in the via holes 18.

Figure 1E:
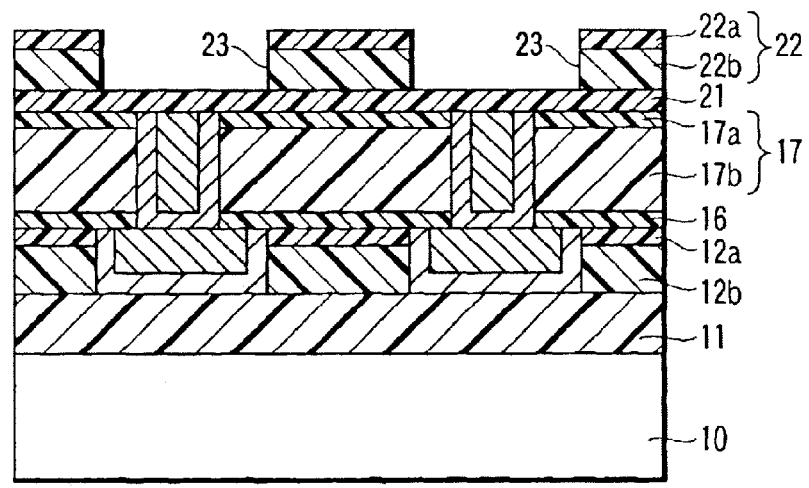
FIG. 1E is a sectional view showing a step subsequent to the step of FIG. 1D.

Next, as shown in FIG. 1E, after depositing a second diffusion preventing layer 21 having the Cu diffusion preventing function and the Cu oxidation preventing function on the whole upper surface of the via plugs 20 and third interlayer insulating layer 17, a fourth interlayer insulating layer 22 having a low dielectric constant is deposited as the insulating layer between the wirings to form a second metal wiring. As the fourth interlayer insulating layer 22, in the present embodiment, the lamination structure of an $SiO_2$ layer 22a/methylpolysiloxane-based insulating layer 22b using the inorganic insulating layer as the cap insulating layer is used. Next, a resist (not shown) is used as the mask to form second wiring grooves 23 by an RIE process to expose portions of the diffusion preventing layer 21 at bottom portions of the grooves 23.

Figure 1F:
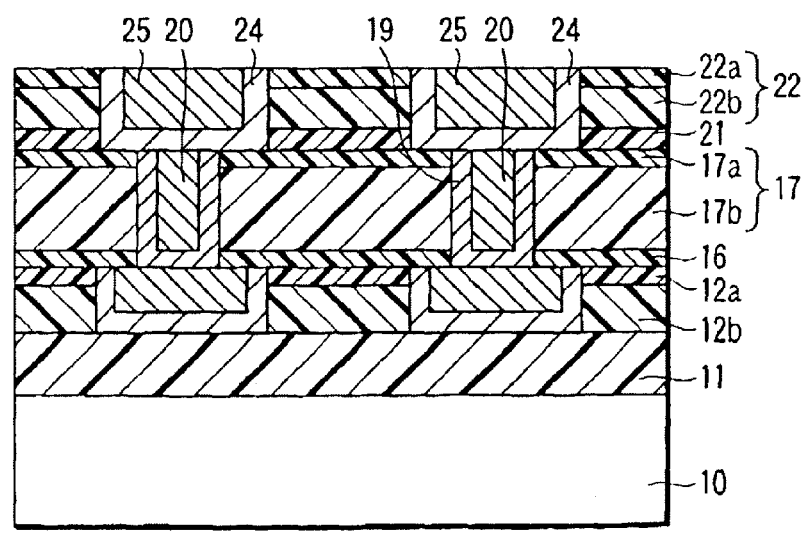
FIG. 1F is a sectional view showing a step subsequent to the step of FIG. 1E.

Next, as shown in FIG. 1F, the exposed portions of the diffusion preventing layer 21 in the bottom portion of the second wiring grooves 23 are etched/removed, and third barrier metals 24 and second wirings 25 are successively deposited on the whole surface of the layer 22 to fill the grooves 23. In this case, a Ta layer is deposited on inner sides of the grooves 23 as the third barrier metal 24 by the sputter process, and subsequently a thick Cu layer is filled in the grooves 23 as the wiring metal layer using the sputter and plating processes. At this time, since the third metal barrier 24 is formed only in the grooves 23 and it is unnecessary to assure the layer thickness of the metal barrier 24 to the connection hole 18 bottom portion, the layer thickness of the third barrier metal 24 may be set to be smaller that that of the second barrier metal 19, and the third barrier metal 24 is deposited only in 5 nm in this embodiment. Subsequently, a CMP process is used to flatten the deposited Cu layer to left as the second wirings 25 only in the second wiring grooves 23.

Thereafter, if necessary, the steps shown in FIGS. 1C to 1F can be repeated to form a multi-layered wiring including a large number of layers above the interlayer insulating layer 22.

It is to be noted that an SiN layer or an SiC layer can be used as the first diffusion preventing layer 16 and second diffusion preventing layer 21 having the Cu diffusion preventing function and the Cu oxidation preventing function. The cap insulating layers 12a, 17a and 22a are not limited to the $SiO_2$ layer, and the SiC layer, for example, also can be used.

As described above, when the multi-layered wiring structure is formed using the single-damascene process, the second barrier metal 19 formed in association with the via plug 20 is formed in a process different from that of the third barrier metal 24 formed in association with the second wiring 25. In the present embodiment, the layer thickness of the second barrier metal 19 is greater than that of the third barrier metal 24.

Moreover, characteristics of the manufacturing method described above in the first embodiment lie in that the method comprises: forming the first insulating layer corresponding to the first wiring layer on the semiconductor substrate; forming the first wiring groove in the first insulating layer; forming the first barrier metal on the whole upper surface of the first insulating layer including the first wiring groove; forming the first metal layer on the whole upper surface of the first barrier metal; removing a portion other than a portion in the first wiring groove from the first metal layer and first barrier metal to form the first wiring layer; forming the second insulating layer on the first wiring layer; forming the connection hole in the second insulating layer; forming the second barrier metal on the whole upper surface of the second insulating layer including the connection hole; forming the second metal layer on the whole upper surface of the second barrier metal; removing a portion other than a portion in the connection hole from the second metal layer and second barrier metal to form the via plug; forming the third insulating layer corresponding to the second wiring layer on the whole upper surface of the second insulating layer in which the via plug is formed; forming the second wiring groove in the third insulating layer; forming the third barrier metal to be thinner than the second barrier metal on the whole upper surface of the third insulating layer including the second wiring groove; forming the third metal layer on the whole upper surface of the third barrier metal; and removing a portion other than a portion in the second wiring groove from the third metal layer and third barrier metal to leave the second wiring layer in the second wiring groove.

According to the multi-layered wiring structure and the manufacturing method of the wiring according to the above-described embodiment, when a low-resistance metal such as Cu is used as the wiring metal, the layer thickness of the second barrier metal 19 is assured to the side wall of the bottom of the via hole 18. Accordingly, it is possible to enhance the reliability of the wiring. Even when the miniaturization of the wiring layer thickness is advanced and the wiring width is reduced, the third barrier metal 24 formed in association with the second wiring 25 can be formed to be thin so as to prevent a percentage of Cu in the wiring from decreasing. As a result, the wiring resistance can be inhibited from increasing, and RC delay can be inhibited from increasing.

<Second Embodiment>

In the first embodiment, to realize both the wiring reliability enhancement and the wiring resistance reduction, the barrier metal 19 of the via plug portion 20 is formed in the layer thickness different from that of the barrier metal 24 of the wiring portion 25. In a second embodiment, the barrier metal 19 of the via plug portion 20 is formed of a layer seed (material) different from that of the barrier metal 24 of the wiring portion 25 to assure the reliability of the barrier metal 19. In this case, the structure of the barrier metal 19 in the second embodiment is the same as that of the first embodiment as shown in FIG. 1F. Therefore, the drawing showing the structure of the second embodiment may be omitted here.

Figure 1G:
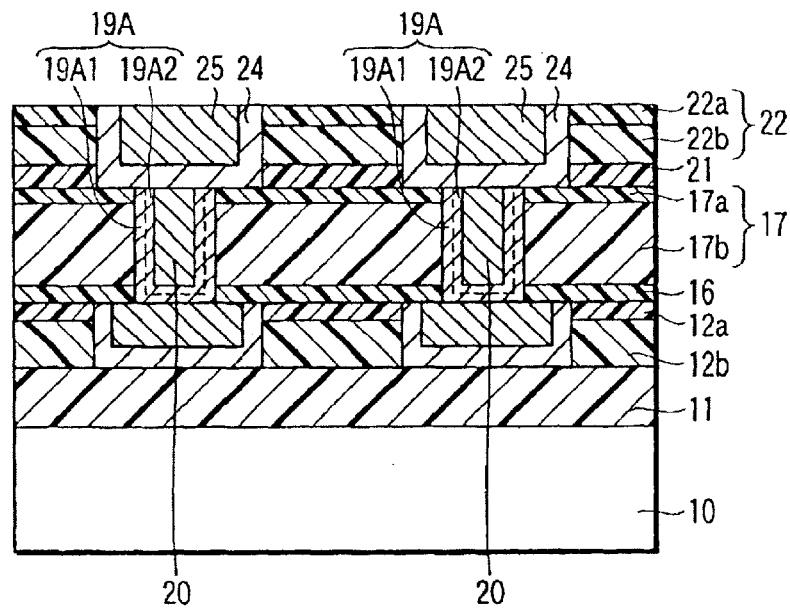
FIG. 1G is a sectional view showing a manufacturing step of the semiconductor device according to a second embodiment of the present invention.

Further, in a modification of the second embodiment as shown in FIG. 1G, the second barrier metal 19A has a double-layered structure in which a Ti layer 19A1 and a TiN layer 19A2 are laminated to form a Ti/TiN laminate layer 19A of 10 nm/10 nm. This laminate layer 19A having a great deoxidation function is deposited as the second barrier metal, and the other constitution is the same as that of the first embodiment shown in FIG. 1F.

According to the multi-layered wiring and manufacturing method using the barrier metal 19A of the second embodiment, the via plug portion 20 has a characteristic different from that of the wiring portion 25 as described above. Therefore, the barrier metal 19A of the via plug portion 20 can enhance the reliability of the wiring at the side wall of the bottom of the via plug portion 20. As a result, the barrier metal 24 of the wiring portion 25 can be made thin and can inhibit the wiring resistance from increasing, and the RC delay can be prevented from being increased.

Moreover, by setting the layer thickness of the barrier metal 19A of the via plug portion 20 to be larger than that of the barrier metal 24 of the wiring portion 25 in the same manner as in the first embodiment, a synergistic effect of the first and second embodiments is obtained for the reason described above in connection with the first embodiment.

<Third Embodiment>

In the first and second embodiments, the single-damascene process is used to selectively form the barrier metal having the Cu diffusion preventing function and the Cu oxidation preventing function on the buried type Cu wiring. In the third embodiment, a dual-damascene process is used.

Figure 2A:
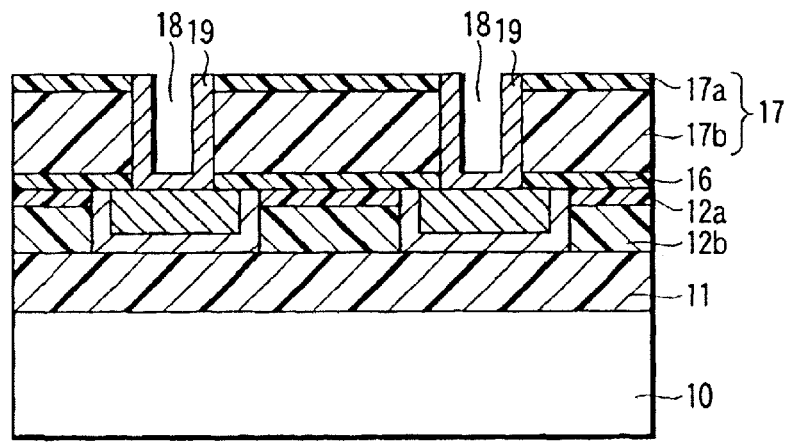
FIG. 2A is a sectional view showing a manufacturing step of the semiconductor device including the multi-layered metal wiring according to a third embodiment of the present invention.
Figure 2B:
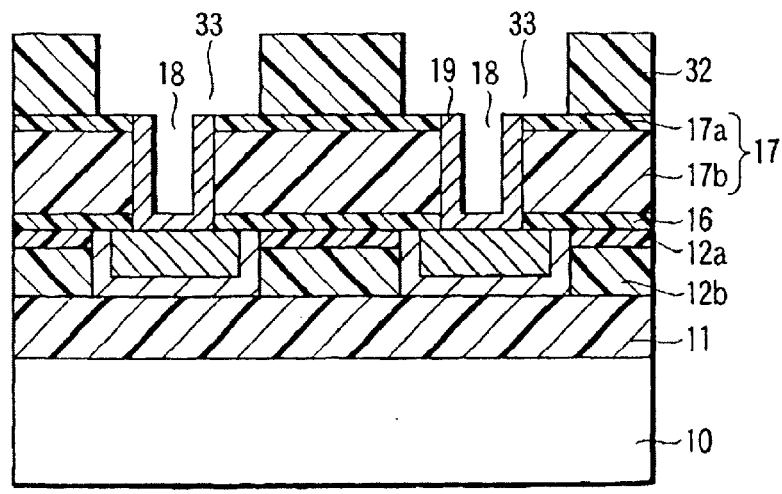
FIG. 2B is a sectional view showing a step subsequent to the step of FIG. 2A.
Figure 2C:
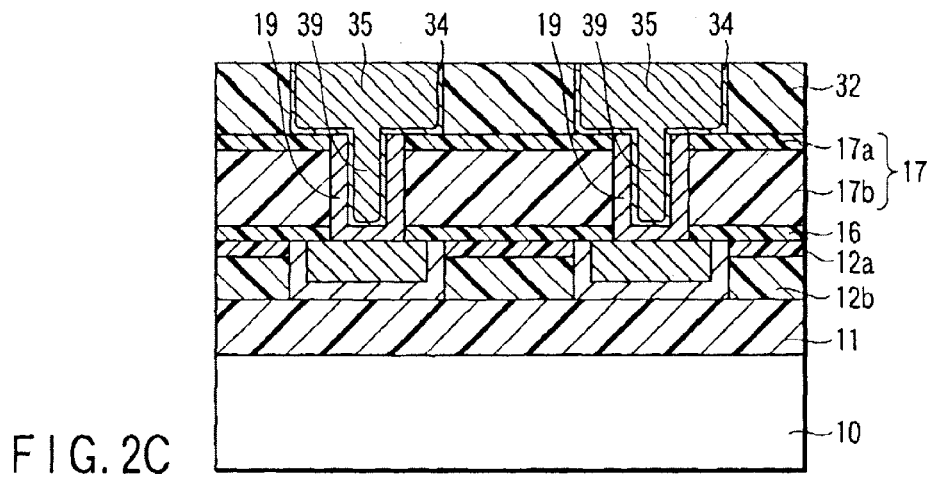
FIG. 2C is a sectional view showing a step subsequent to the step of FIG. 2B.

FIGS. 2A to 2C show sectional views in a part of the manufacturing method of the semiconductor device including the multi-layered metal wiring according to the third embodiment.

It is to be noted that in the sectional views of the present embodiment, the forming steps of the element isolating structure and MOSFET are omitted, and the step of forming the buried type Cu wiring and subsequently alternately stacking the insulating layer and wiring layer to form the metal wiring structure having a unit of the two-layers is shown.

The process of the third embodiment is different from that of the first embodiment in a step subsequent to the step shown in FIG. 2A, which corresponds to the step of depositing the second barrier metal 19 on the inner surface of the via hole 18 formed in the third interlayer insulating layer 17 as shown in FIGS. 1A to 1C. The different portion will mainly be described hereinafter.

That is, as shown in FIGS. 2A and 2B, after depositing Ta as the second barrier metal 19 with a thickness of 15 nm, a fourth interlayer insulating layer 32 having the low dielectric constant is deposited so as to form the second wiring layer on the whole upper surface of the third interlayer insulating layer 17, without depositing a metal for forming the via plug 20 and the second diffusion preventing layer 21 shown in FIG. 1D. As the fourth interlayer insulating layer 32, in the present third embodiment, polyarylene of an organic insulating layer is used. Here, the dielectric constant of polyarylene is about 2.2. Next, a resist mask (not shown) and a hard mask of the inorganic insulating layer are used as the masks to form a second wiring groove 33 in the insulating layer 32 by an RIE process, while the via holes 18 are again etched.

Next, as shown in FIG. 2C, Ta layers as third barrier metals 34 are deposited on the inner surfaces of the second barrier metals 19 formed on the inner surfaces of the via holes 18 as well as on the inner surfaces of the second wiring grooves 33, so as to cover the whole upper surface of the fourth interlayer insulating layer 32 by the sputter process. At this time, since the barrier metals 19 are already formed in the former process, the assurance of the barrier metals 34 with respect to the thickness thereof at the bottom portion of the via holes 18 is unnecessary in this third embodiment. Therefore, the layer thickness of the third barrier metals 34 may be set to be smaller than that of the second barrier metal 19. For example, the thickness of the barrier metal 34 is deposited in about 5 nm. Accordingly, the total thickness of the barrier metals of the via hole portion 18 is deposited in 20 nm, and the barrier metal 34 at the insulating layer 32 of the second wiring groove 33 is deposited in 5 nm.

Next, the Cu layer forming the wiring metal is deposited on the whole upper surface of the third barrier metal 34 using the sputter and plating processes, and the via holes 18 and the second wiring grooves 33 are filled with the Cu layer for the via plugs 39 and the wirings 35. Moreover, the CMP process is used to flatten the Cu layer, and the portion deposited on the upper surface of the fourth interlayer insulating layer 32 is removed from the Cu layer and third barrier metal 34 to leave the Cu layer as via plugs 39 in the via holes 18. Additionally, the Cu layer is also left as second wirings 35 in the second wiring grooves 33.

Thereafter, if necessary, the steps shown in FIGS. 1C, 2A to 2C can be repeated to form the multi-layered wiring including the large number of wiring layers above the interlayer insulating layer 32.

That is, in the multi-layered wiring structure formed using the dual-damascene process as described above, the via plugs 39 and second wirings 35 are formed in the same step by the dual-damascene process. The layer thickness of the second barrier metal at the via plug 39 portion is greater than that of the third barrier metal 34 of the second wiring 35 portion. In this case, the layer thickness of the second barrier metal 19 increases by the latter forming step of the third barrier metal 34.

Therefore, according to the above-described multi-layered wiring structure and manufacturing method thereof, the advantages similar to that described in the first embodiment, that is, wiring reliability enhancement and the wiring resistance reduction using the dual-damascene process is also obtained.

<Fourth Embodiment>

In the third embodiment, to realize both the wiring reliability enhancement and the wiring resistance reduction using the dual-damascene process, the barrier metal 19 of the via plug portion 20 in the connection hole 18 is formed in the layer thickness different from that of the third barrier metal 34 of the wiring portion 35. In the fourth embodiment, different layer seeds or materials are used for the barrier metals 19 and 34 to realize the similar advantages as the former embodiments.

The fourth embodiment is different from the third embodiment in that a barrier layer corresponding to that 19 shown in FIG. 2A having a great deoxidation function is deposited as the second barrier metal 19. The layer structure of the fourth embodiment is the same as that of the third embodiment, and a drawing showing the structure is omitted here.

Figure 2D:
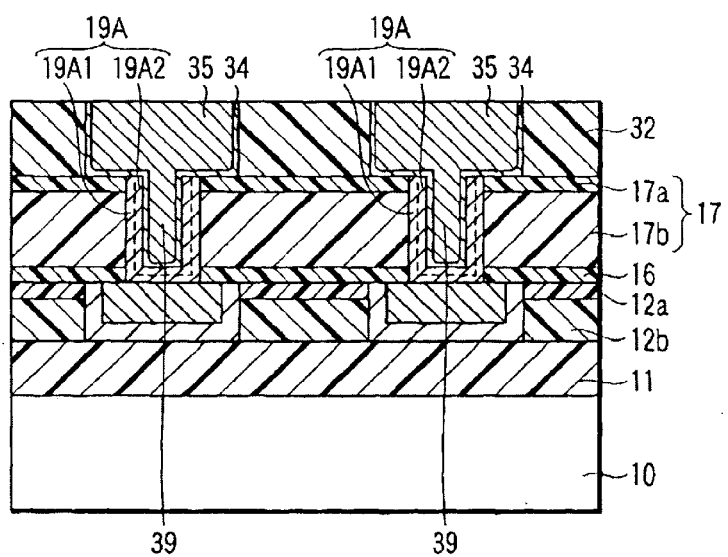
FIG. 2D is a sectional view showing a manufacturing step of the semiconductor device according to a fourth embodiment of the present invention.

Further, a modification of the fourth embodiment will be described by referring to FIG. 2D showing the modification of the third embodiment. As shown in FIG. 2D, the modification is configured to have a double-layered barrier metal layer such as a Ti/TiN laminate layer 19A including a Ti layer 19A1 of 10 nm and a TiN layer 19A2 of 10 nm. The other constitution thereof is the same as that shown in FIG. 2C and the detailed explanation is omitted here.

According to the multi-layered wiring and manufacturing method using the barrier metals 19, 34 in which the via plug 39 portion has the characteristic different from that of the wiring 35 portion as described above, the barrier metal 19 of the via plug portion 39 can enhance the reliability of the wiring in the side wall of the bottom of the via plug 39. The barrier metal 34 of the wiring 35 portion is thin and prevents the wiring resistance from being increased, and the RC delay can be inhibited from increasing.

Moreover, since the layer thickness of the barrier metal (layers 19A and 34) at the via plug 39 portion is set to be larger than that of the barrier metal (a single barrier metal 34) at the wiring 35 portion, the synergistic advantage is obtained for the reason described above in the first to third embodiments.

<Fifth Embodiment>

In the first and second embodiments, to realize both the reliability enhancement of the wiring and the reduction of the wiring resistance using the single-damascene process, the layer thickness or layer seed or material of the barrier metal of the via plug portion 20 is set to be different from that of the barrier metal of the wiring portion 25. In a fifth embodiment, the barrier metal of the via plug portion is formed in a layer forming method different from that of the barrier metal of the wiring portion to realize the advantage.

The fifth embodiment is different from the first or second embodiment in that the barrier metal layer is formed using a chemical vapor deposition (CVD) process in forming the second barrier metal, and the sputter process is used to form the layer in forming the third barrier metal. The other constitution is the same as those of the first to fourth embodiments. Therefore, together with FIGS. 3A, 3B, FIG. 1F showing the structure of the first embodiment is also used as a drawing which shows a manufacturing step of the fifth embodiment.

Figures 3A, 3B:
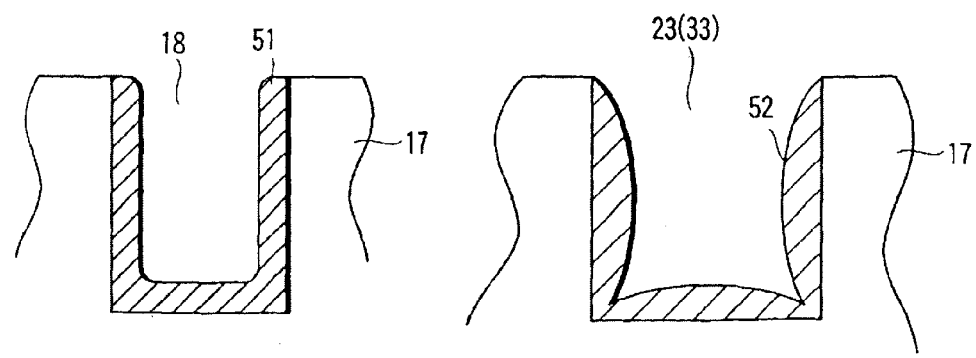
FIG. 3A is a sectional view showing a manufacturing step of the semiconductor device including the multi-layered metal wiring according to a fifth embodiment of the present invention.
FIG. 3B is a sectional view showing a manufacturing step subsequent to the step of FIG. 3A.

In this case, as shown in FIG. 3A, when the barrier metal 51 is formed on an inner wall of the via hole 18 using the CVD process, it is possible to assure that the layer thickness of the barrier metal 51 on the side wall of the bottom portion of the via hole 18 as shown in FIG. 3A. As a result, the coat property of the barrier metal 51 with respect to corner portions of the via hole 18 near the bottom portion thereof becomes satisfactory. The reliability of the wiring can be enhanced.

Moreover, as shown in FIG. 3B, when a barrier metal 52 of a wiring portion in the wiring groove 23 shown in FIG. 3B (or the wiring groove 33 shown in FIG. 2B) is formed into the layer using the sputter process, the barrier metal 52 can be formed to be thin. Therefore, even when the reduction of the layer thickness of wirings is advanced and the wiring width is reduced, it is possible to prevent the percentage of copper in the wiring from being decreased. As a result, the wiring resistance is also inhibited from increasing, and the RC delay can be inhibited from increasing.

Furthermore, since the barrier metal 19 of the via plug 20 portion is formed to be thicker than the layer 24 of the wiring 25 portion, the advantage similar to that of the first or second embodiment is also obtained.

<Sixth Embodiment>

In the third and fourth embodiments, to realize both the reliability enhancement of the wiring and the reduction of the wiring resistance using the dual-damascene process, the layer thickness or layer seed (material) of the barrier metal of the via plug portion is set to be different from that of the barrier metal of the wiring portion. In a sixth embodiment, the barrier metal of the via plug portion is formed in a layer forming method different from that of the barrier metal of the wiring portion to realize the advantages described in connection with the earlier embodiments.

Namely, the sixth embodiment is different from the third or fourth embodiment in that the CVD process is used to form the second barrier metal 19, and the sputter process is used to form the third barrier metal 34. The other constitution is the same. Therefore, FIG. 2C is also used as a drawing which shows the constitution of the sixth embodiment.

Therefore, the advantages similar to those described in the fifth embodiment are obtained.

As described above, according to the present invention, since the barrier metal at the via plug portion is different in thickness from the barrier metal at the wiring portion, the wiring resistance can be reduced without deteriorating the reliability of the wiring. Further, since the via plug portion is different from the wiring portion in the material of the barrier metal, the wiring resistance can be reduced without deteriorating the reliability of the wiring. Furthermore, since the via plug portion is different from the wiring portion in the layer forming method of the barrier metal, the wiring resistance can be reduced without deteriorating the reliability of the wiring.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor device comprising:
    a first metal wiring buried, via a first barrier metal, in a first wiring groove formed in a first insulating layer formed on a semiconductor substrate;
    a second insulating layer formed on the first metal wiring;
    a via plug formed of a metal buried, via a second barrier metal, in a via hole formed in the second insulating layer to be electrically connected to the first metal wiring;
    a third insulating layer formed on the second insulating layer in which the via plug is buried; and
    a second metal wiring buried in a second wiring groove formed in the third insulating layer via a third barrier metal having a layer thickness different from that of the second barrier metal to be electrically connected to via plug.

2. A semiconductor device according to claim 1, wherein layer thickness of the second barrier metal is greater than that of the third barrier metal.

3. A semiconductor device according to claim 1, wherein the via plug and second metal wiring are formed in separate steps by a single-damascene process.

4. A semiconductor device according to claim 2, wherein the via plug and second metal wiring are formed in separate steps by a single-damascene process.

5. The semiconductor device according to claim 1, wherein the via plug and second metal wiring are formed in the same step by a dual-damascene process.

6. The semiconductor device according to claim 2, wherein the via plug and second metal wiring are formed in the same step by a dual-damascene process.

7. A semiconductor device comprising:

a first metal wiring buried, via a first barrier metal, in a first wiring groove formed in a first insulating layer formed on a semiconductor substrate;

a second insulating layer formed on the first metal wiring;

a via plug formed of a metal buried, via a second barrier metal, in a via hole formed in the second insulating layer to be electrically connected to the first metal wiring;

a third insulating layer formed on the second insulating layer in which the via plug is buried; and a second metal wiring buried in a second wiring groove formed in the third insulating layer via a third barrier metal including a material different from that of the second barrier metal to be electrically connected to the second metal wiring.

8. A semiconductor device according to claim 7, wherein the second barrier metal is a Ti/TiN laminate layer, and the third barrier metal is a Ta layer.

9. The semiconductor device according to claim 7, wherein the via plug and second metal wiring are formed in separate steps by a single-damascene process.

10. The semiconductor device according to claim 8, wherein the via plug and second metal wiring are formed in separate steps by a single-damascene process.

11. The semiconductor device according to claim 7, wherein the via plug and second metal wiring are formed in the same step by a dual-damascene process.

12. The semiconductor device according to claim 8, wherein the via plug and second metal wiring are formed in the same step by a dual-damascene process.

13. The semiconductor device according to any one of claims 7, wherein the layer thickness of the second barrier metal is greater than that of the third barrier metal.

14. The semiconductor device according to claim 7, wherein the second barrier metal has a laminate layer structure.

15. The semiconductor device according to claim 14, wherein the laminate layer structure has a great deoxidation function.

16. A semiconductor device comprising:

a first metal wiring buried, via a first barrier metal, in a first wiring groove formed in a first insulating layer formed on a semiconductor substrate;

a second insulating layer formed on the first metal wiring;

a via plug formed of a metal buried, via a second barrier metal, in a via hole formed in the second insulating layer to be electrically connected to the first metal wiring;

a third insulating layer formed on the second insulating layer in which the via plug is buried; and a second metal wiring buried in a second wiring groove formed in the third insulating layer via a third barrier metal which is formed into a layer in a process different from that of the second barrier metal to be electrically connected to the via plug.

17. A semiconductor device according to claim 16, wherein the second barrier metal is formed into the layer by a CVD process, and the third barrier metal is formed into the layer by a sputter process.

18. The semiconductor device according to claim 16, wherein the via plug and second metal wiring are formed in separate steps by a single-damascene process.

19. The semiconductor device according to claim 17, wherein the via plug and second metal wiring are formed in separate steps by a single-damascene process.

20. The semiconductor device according to claim 16, wherein the via plug and second metal wiring are formed in the same step by a dual-damascene process.

21. The semiconductor device according to claim 17, wherein the via plug and second metal wiring are formed in the same step by a dual-damascene process.

22. The semiconductor device according to any one of claims 16, wherein the layer thickness or material of the second barrier metal is different from that of the third barrier metal.

* * * * *